(12) United States Patent
Tsai

(10) Patent No.: US 9,831,892 B1
(45) Date of Patent: Nov. 28, 2017

(54) NOISE REDUCTION CIRCUIT AND ASSOCIATED DELTA-SIGMA MODULATOR

(71) Applicant: MEDIATEK INC., Hsin-Chu (TW)

(72) Inventor: Hung-Chieh Tsai, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/629,731

(22) Filed: Jun. 21, 2017

Related U.S. Application Data

(60) Provisional application No. 62/360,986, filed on Jul. 12, 2016.

(51) Int. Cl.
H03M 1/06 (2006.01)
H03M 3/00 (2006.01)
H03M 1/12 (2006.01)
H03M 1/00 (2006.01)

(52) U.S. Cl.
CPC ........... *H03M 3/322* (2013.01); *H03M 3/422* (2013.01); *H03M 3/50* (2013.01); *H03M 1/00* (2013.01); *H03M 1/12* (2013.01); *H03M 3/30* (2013.01)

(58) Field of Classification Search
CPC ............. H03M 1/00; H03M 1/12; H03M 3/30
USPC .................................. 341/118, 143, 155, 156
See application file for complete search history.

(56) References Cited

U.S. PATENT DOCUMENTS 9,276,792 B1 * 3/2016 Makinwa ............ H04L 27/2334
2017/0257235 A1 9/2017 Lu

OTHER PUBLICATIONS

Chen-Yen Ho et al., "A 4.5 mW CT Self-Coupled ΔΣ Modulator With 2.2 MHz BW and 90.4 dB SNDR Using Residual ELD Compensation", IEEE Journal of Solid-State Circuits, vol. 50, No. 12, Dec. 2015, pp. 2870-2879, 2015 IEEE.
Hung-Chieh Tsai et al., "A 64-fJ/Conv.-Step Continuous-Time ΣΔ Modulator in 40-nm CMOS Using Asynchronous SAR Quantizer and Digital ΔΣ Truncator", IEEE Journal of Solid-State Circuits, vol. 48, No. 11, Nov. 2013, pp. 1-12, 2013 IEEE.

* cited by examiner

*Primary Examiner* — Joseph Lauture
(74) *Attorney, Agent, or Firm* — Winston Hsu

(57) ABSTRACT

A circuit includes a transistor, a signal generating circuit and a noise sensing circuit. The signal generating circuit is arranged to provide an input signal. The noise sensing circuit is coupled to the transistor and the signal generating circuit, and the noise sensing circuit is arranged for receiving the input signal provided by the signal generating circuit to generate an output signal to the transistor, wherein a signal component of the output signal generated by the noise sensing circuit cancels out a signal component of the input signal provided by the signal generating circuit, and the output signal and the input signal have opposite polarities.

20 Claims, 9 Drawing Sheets

NOISE REDUCTION CIRCUIT AND ASSOCIATED DELTA-SIGMA MODULATOR

CROSS REFERENCE TO RELATED APPLICATIONS

This application claims the priority of U.S. Provisional Application No. 62/360,986, filed on Jul. 12, 2016, which is included herein by reference in its entirety.

BACKGROUND

A delta-sigma modulator generally suffers a quantization noise and a digital-to-analog converter (DAC) noise that may worsen the signal quality and circuit efficiency. The quantization noise can be reduced by increasing an oversampling ratio (OSR), quantization bit number or loop filter order. However, the DAC noise from a bias source cannot be easily cancelled while a large swing input is applied. One solution to cancel the DAC noise is to add a bulky resistor-capacitor low-pass filter in the bias path. However, the bulky resistor-capacitor low-pass filter may occupy large chip area and increase the manufacturing cost.

SUMMARY

It is therefore an objective of the present invention to provide a circuit, which can reduce the circuit noise such as DAC noise without using a low-pass filter, to solve the above-mentioned problem.

According to one embodiment of the present invention, a circuit includes a transistor, a signal generating circuit and a noise sensing circuit. The signal generating circuit is arranged to provide an input signal. The noise sensing circuit is coupled to the transistor and the signal generating circuit, and the noise sensing circuit is arranged for receiving the input signal provided by the signal generating circuit to generate an output signal to the transistor, wherein a signal component of the output signal generated by the noise sensing circuit cancels out a signal component of the input signal provided by the signal generating circuit, and the output signal and the input signal have opposite polarities.

According to another embodiment of the present invention, a delta-sigma modulator comprises a receiving circuit, a loop filter, a quantizer and a digital to analog converter. The receiving circuit is arranged for receiving a feedback signal and an input signal to generate a summation signal. The loop filter comprises a plurality of amplifying stages connected in series and arranged to receive the summation signal to generate a filtered summation signal. The quantizer is coupled to the loop filter, and is arranged for generating a digital output signal according to the filtered summation signal. The digital to analog converter is coupled to the quantizer and the receiving circuit, and is arranged for performing a digital to analog converting operation upon a signal derived from the digital output signal to generate the feedback signal to the receiving circuit. The digital to analog converter comprises a circuit, and the circuit comprises a transistor, a noise sensing circuit and a current mirror. The noise sensing circuit is coupled to the transistor and a signal generating circuit, and the noise sensing circuit is arranged for receiving an input signal provided by the signal generating circuit to generate an output signal to the transistor, wherein a signal component of the output signal generated by the noise sensing circuit cancels out a signal component of the input signal provided by the signal generating circuit, and the output signal and the input signal have opposite polarities; and the current mirror is arranged for mirroring a current from the transistor to generate a mirrored current to the receiving circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
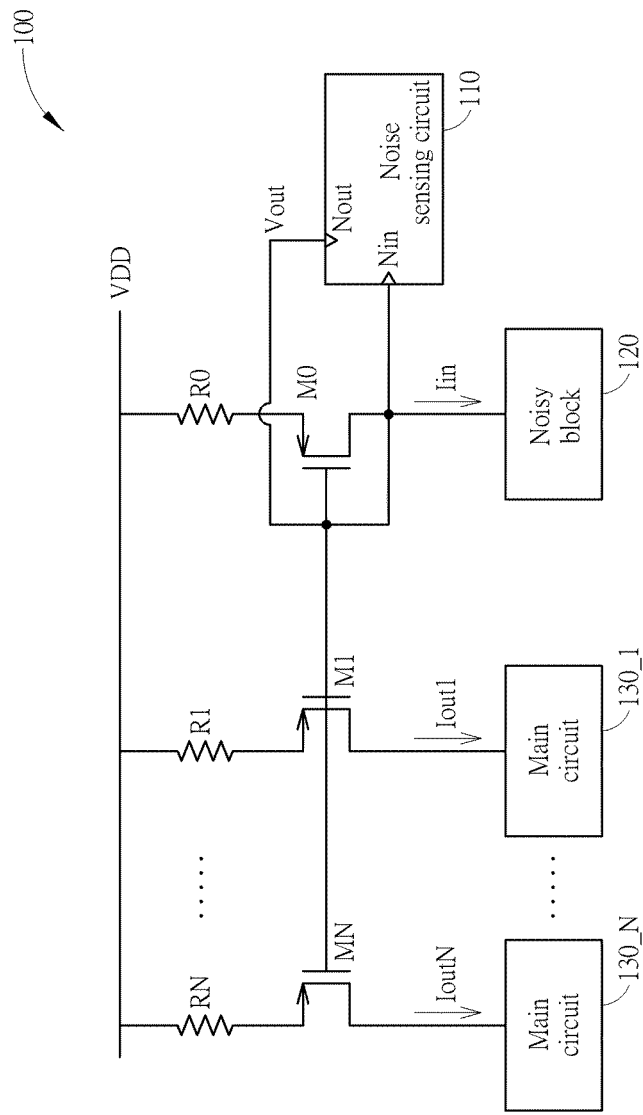
FIG. 1 is a diagram illustrating a circuit according to one embodiment of the present invention.

Please refer to FIG. 1, which is a diagram illustrating a circuit 100 according to one embodiment of the present invention. As shown in FIG. 1, the circuit 100 comprises a noise sensing circuit 110, a signal generating circuit (in this embodiment, the signal generating circuit is represented by a noisy block 120), a plurality of main circuits 130_1-130_N, a plurality of transistors (PMOS) M0-MN, and a plurality of resistors R0-RN. In this embodiment, the circuit 100 is used to cancel the noise contributed from the previous stages (e.g. the noisy block 120) and to provide noise-cancelled signals to the following stages (e.g. the main circuits 130_1-130_N).

In the embodiment shown in FIG. 1, the noisy block 120 can be any voltage source or current source with signals and noises, for example, the noisy block 120 may be a bandgap reference voltage generator or a reference current generator. The diode-connected transistor M0 is used to receive an input signal (e.g. an input current Iin shown in FIG. 1), and the transistors M1-MN serve as current mirrors to mirror the input current Iin to generate mirrored currents Iout1-IoutN to the main circuits 130_1-130_N, respectively. Because the input current Iin is noisy, the mirrored currents Iout1-IoutN may also be noisy. Therefore, the noise sensing circuit 110 is arranged to sense the noise component of the input current Iin at an input terminal Nin to generate an output signal Vout at an output terminal Nout to a gate electrode of the transistor M0, to cancel or reduce the noise contributed by the noise component of the input current Iin. By using the noise sensing circuit 110, the noise at the gate electrode of the transistor M0 can be reduced, thereby the current mirrors (i.e. the transistors M1-MN) can generate the noise-cancelled mirrored currents Iout1-IoutN, respectively.

In this embodiment, the main circuits 130_1-130_N can be any circuit required to use a current generated according to the input current Iin. For example, the main circuit 130_1 may be a continuous time delta-sigma modulator, and the mirrored current Iout1 flows into an input node of the continuous time delta-sigma modulator.

In detail, the input current Iin may be a DC current provided by the noisy block 120, and when the input current Iin suddenly has a noise component, the gate electrode of the transistor M0 will directly suffers this noise component. Meanwhile, the noise sensing circuit 110 generates the output signal Vout that has opposite polarity to the noise component of the input current Iin (i.e. the phases of the output signal Vout and the noise component are inverted) to the gate electrode of the transistor M0, to cancel the noise component provided by the input current Iin. In other words, when the noisy block 120 provides a noise component to the gate electrode of the transistor M0, the noise sensing circuit 110 can immediately generate an inverted noise component to the gate electrode of the transistor M0, thus the inverted noise component generated by the noise sensing circuit 110 cancels out the noise component provided by the noisy block 120. Therefore, a voltage level of the gate electrodes of the transistors M0-MN may be more stable, without being affected by the noise component of the input signal Iin.

In addition, in the embodiment shown in FIG. 1, since the noise sensing circuit 110 can reduce the noise from the previous stage to the following stages, a low-pass filter may not be needed between the current mirrors (i.e. the transistors M1-MN) and the transistor M0, and thus a capacitor connected to the gate electrode of the transistors M0 may not be needed and the chip area can be reduced.

Figure 2:
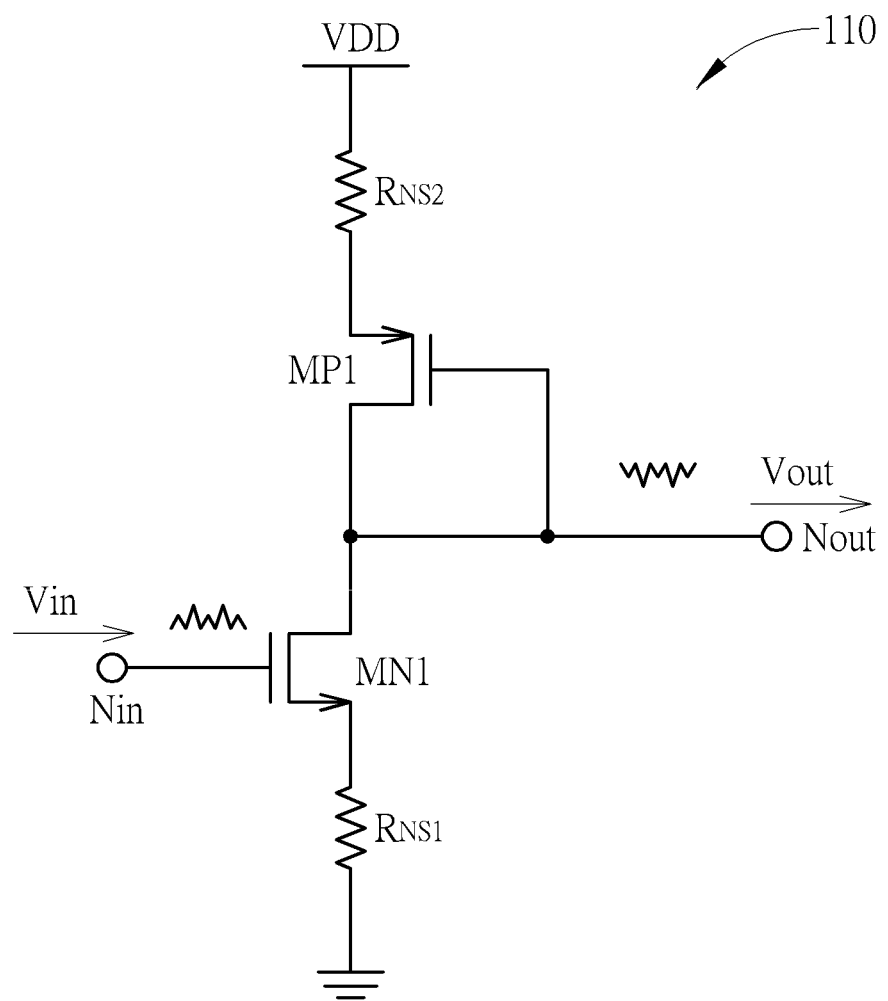
FIG. 2 is a diagram illustrating the noise sensing circuit according to a first embodiment of the present invention.

FIG. 2 is a diagram illustrating the noise sensing circuit 110 according to one embodiment of the present invention. As shown in FIG. 2, the noise sensing circuit 110 comprises a PMOS MP1, an NMOS MN1 and two resistors $R_{NS1}$ and $R_{NS2}$. A gate electrode of the NMOS MN1 serves as the input terminal Nin to receive an input signal Vin (e.g. a voltage-type noise component of input current Iin), a source electrode of the NMOS MN1 is coupled to a ground voltage via the resistor $R_{NS1}$, and a drain electrode of the NMOS MN1 serves as the output terminal Nout to generate the output signal Vout. A source electrode of the PMOS MP1 is connected to a supply voltage VDD via the resistor $R_{NS2}$, and both the gate electrode and the drain electrode of the PMOS MP1 are connected to the drain electrode of the NMOS MN1. A ratio between the resistances of the resistors $R_{NS1}$ and $R_{NS2}$ can be design to determine a gain of the noise sensing circuit 110. Therefore, the gain can be robust to process, voltage and temperature (PVT) variation. In this embodiment, the output signal Vout and the input signal Vin have opposite polarities (i.e. the phases are inverted).

Figure 3:
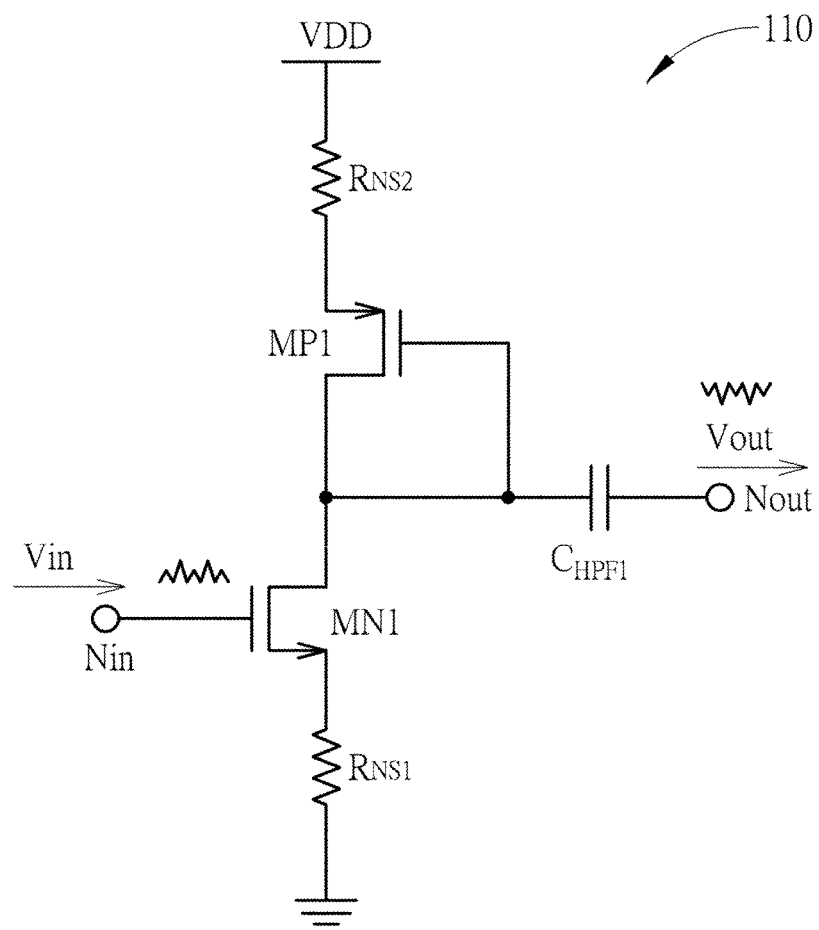
FIG. 3 is a diagram illustrating the noise sensing circuit according to a second embodiment of the present invention.

To avoid an unwanted effect that a DC level of the drain electrode of the NMOS MN1 affects the gate electrode of the transistor M0, a capacitor $C_{HPF1}$ may be positioned between the output terminal Nout and the drain electrode of the NMOS MN1 as shown in FIG. 3. Hence, the mentioned effect can be eliminated.

Figure 4:
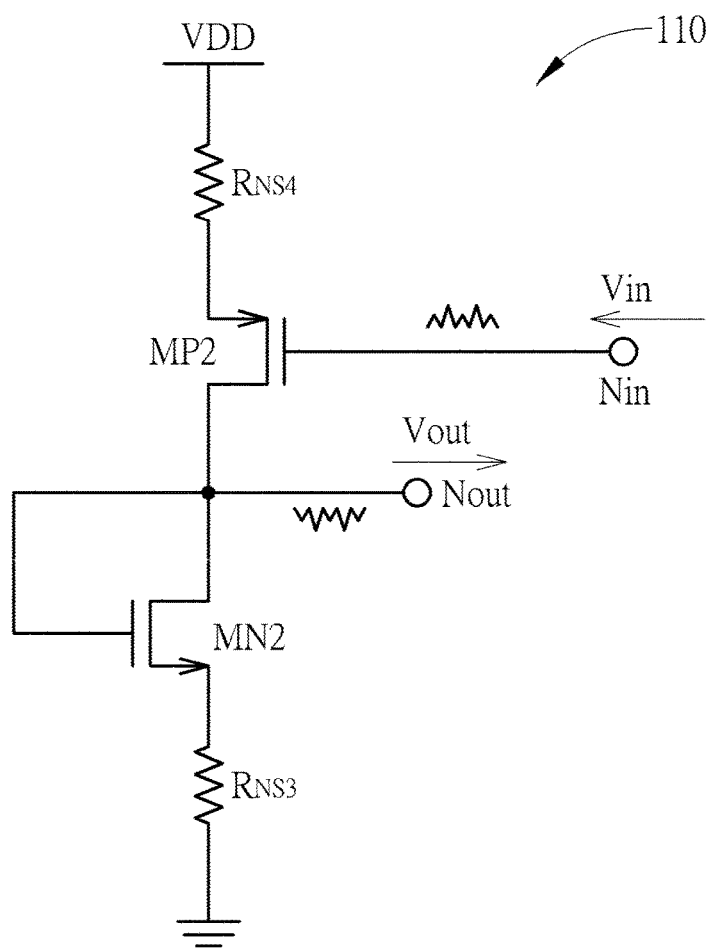
FIG. 4 is a diagram illustrating the noise sensing circuit according to a third embodiment of the present invention.

FIG. 4 is a diagram illustrating the noise sensing circuit 110 according to another embodiment of the present invention. As shown in FIG. 4, the noise sensing circuit 110 comprises a PMOS MP2, an NMOS MN2 and two resistors $R_{NS3}$ and $R_{NS4}$. A gate electrode of the PMOS MP2 serves as the input terminal Nin to receive the input signal Vin (e.g. a voltage-type noise component of input current Iin), a source electrode of the PMOS MP2 is coupled to the supply voltage ground voltage via the resistor $R_{NS4}$, and a drain electrode of the PMOS MP2 serves as the output terminal Nout to generate the output signal Vout. A source electrode of the NMOS MN2 is coupled to the ground voltage VDD via the resistor $R_{NS3}$, and both the gate electrode and the drain electrode of the NMOS MN2 are coupled to the drain electrode of the PMOS MP2. A ratio between the resistances of the resistors $R_{NS3}$ and $R_{NS4}$ can be design to determine a gain of the noise sensing circuit 110. Therefore, the gain can be robust to PVT variation. In this embodiment, the output signal Vout and the input signal Vin have opposite polarities (i.e. the phases are inverted).

Figure 5:
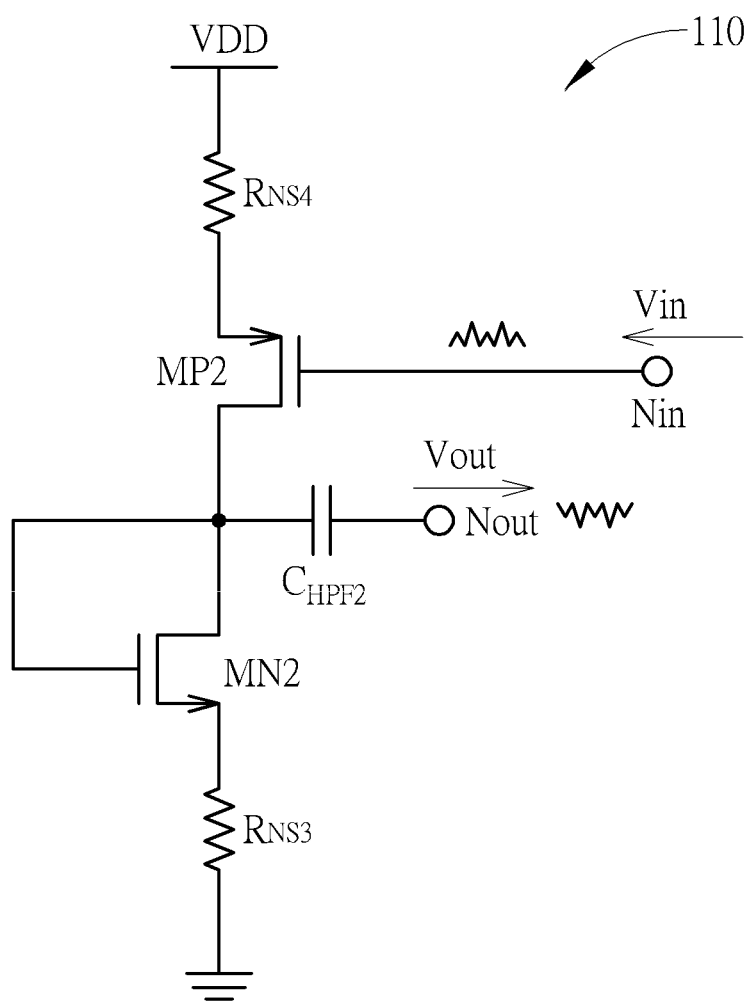
FIG. 5 is a diagram illustrating the noise sensing circuit according to a fourth embodiment of the present invention.

To avoid an unwanted effect that a DC level of the drain electrode of the PMOS MP2 affects the gate electrode of the transistor M0, a capacitor $C_{HPF2}$ may be positioned between the output terminal Nout and the drain electrode of the PMOS MP2 as shown in FIG. 5. Hence, the mentioned effect can be eliminated.

Figure 6:
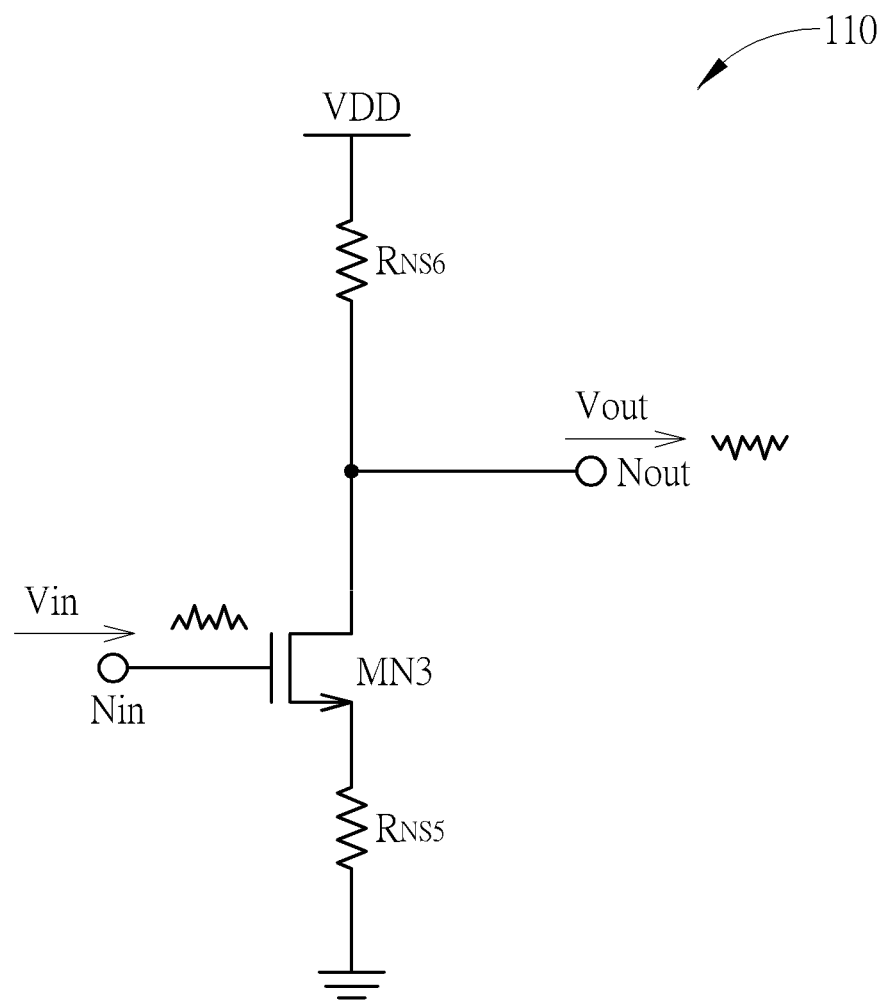
FIG. 6 is a diagram illustrating the noise sensing circuit according to a fifth embodiment of the present invention.

FIG. 6 is a diagram illustrating the noise sensing circuit 110 according to another embodiment of the present invention. As shown in FIG. 6, the noise sensing circuit 110 comprises an NMOS MN3 and two resistors $R_{NS5}$ and $R_{NS6}$. A gate electrode of the NMOS MN3 serves as the input terminal Nin to receive the input signal Vin (e.g. a voltage-type noise component of input current Iin), a drain electrode of the NMOS MN3 serves as the output terminal Nout to generate the output signal Vout, a source electrode of the NMOS MN3 is coupled to the ground voltage via the resistor $R_{NS5}$, and the drain electrode of the NMOS MN3 is coupled to the supply voltage VDD via the resistor $R_{NS6}$. In addition, a resistance of the resistor $R_{NS6}$ can be designed to make a current flowing through the resistor $R_{NS6}$ close to the input current Iin provided by the noisy block 120 (i.e. the current value of the resistor $R_{NS6}$ is close to the current value of the input current Iin), to prevent the current within the noise sensing circuit 110 from flowing to the external circuit.

Figure 7:
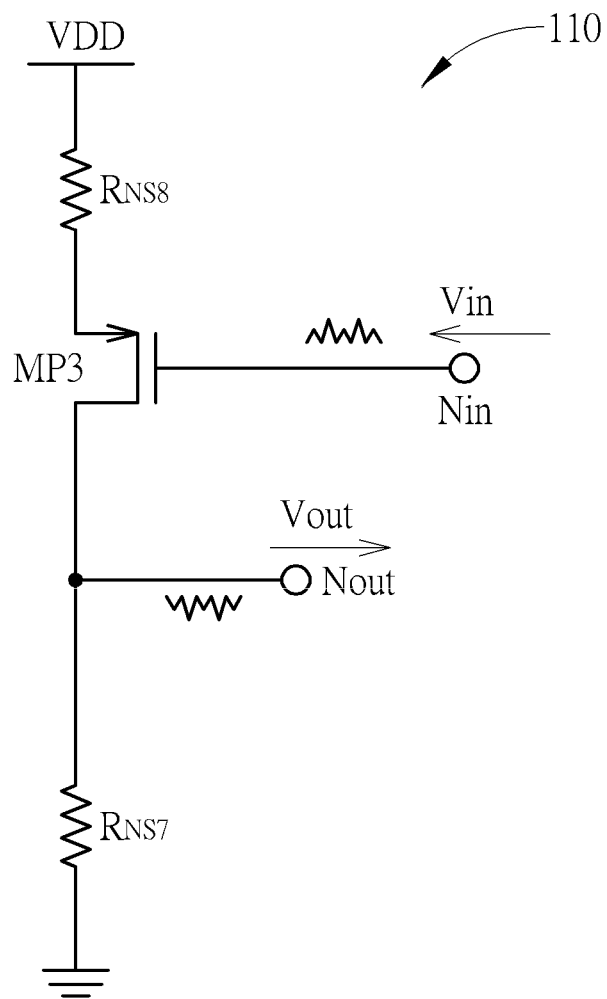
FIG. 7 is a diagram illustrating the noise sensing circuit according to a sixth embodiment of the present invention.

FIG. 7 is a diagram illustrating the noise sensing circuit 110 according to another embodiment of the present invention. As shown in FIG. 7, the noise sensing circuit 110 comprises a PMOS MP3 and two resistors $R_{NS7}$ and $R_{NS8}$. A gate electrode of the PMOS MP3 serves as the input terminal Nin to receive the input signal Vin (e.g. a voltage-type noise component of input current Iin), a drain electrode of the PMOS MP3 serves as the output terminal Nout to generate the output signal Vout, a source electrode of the PMOS MP3 is coupled to the supply voltage VDD via the resistor $R_{NS8}$, and the drain electrode of the PMOS MP3 is coupled to the ground voltage via the resistor $R_{NS7}$. In addition, a resistance of the resistor $R_{NS7}$ can be designed to make a current flowing through the resistor $R_{NS7}$ close to the input current Iin provided by the noisy block 120 (i.e. the current value of the resistor $R_{NS7}$ is close to the current value of the input current Iin), to prevent the current within the noise sensing circuit 110 from flowing to the external circuit.

In the embodiments shown in FIGS. 2-7, the noise sensing circuit 110 is implemented by a single stage amplifier. In other embodiments, however, the noise sensing circuit 110 can be implemented by a multi-stage amplifier, and each stage may be implemented by any one of the embodiments shown in FIGS. 2-7. This alternative design shall fall within the scope of the present invention.

Figure 8:
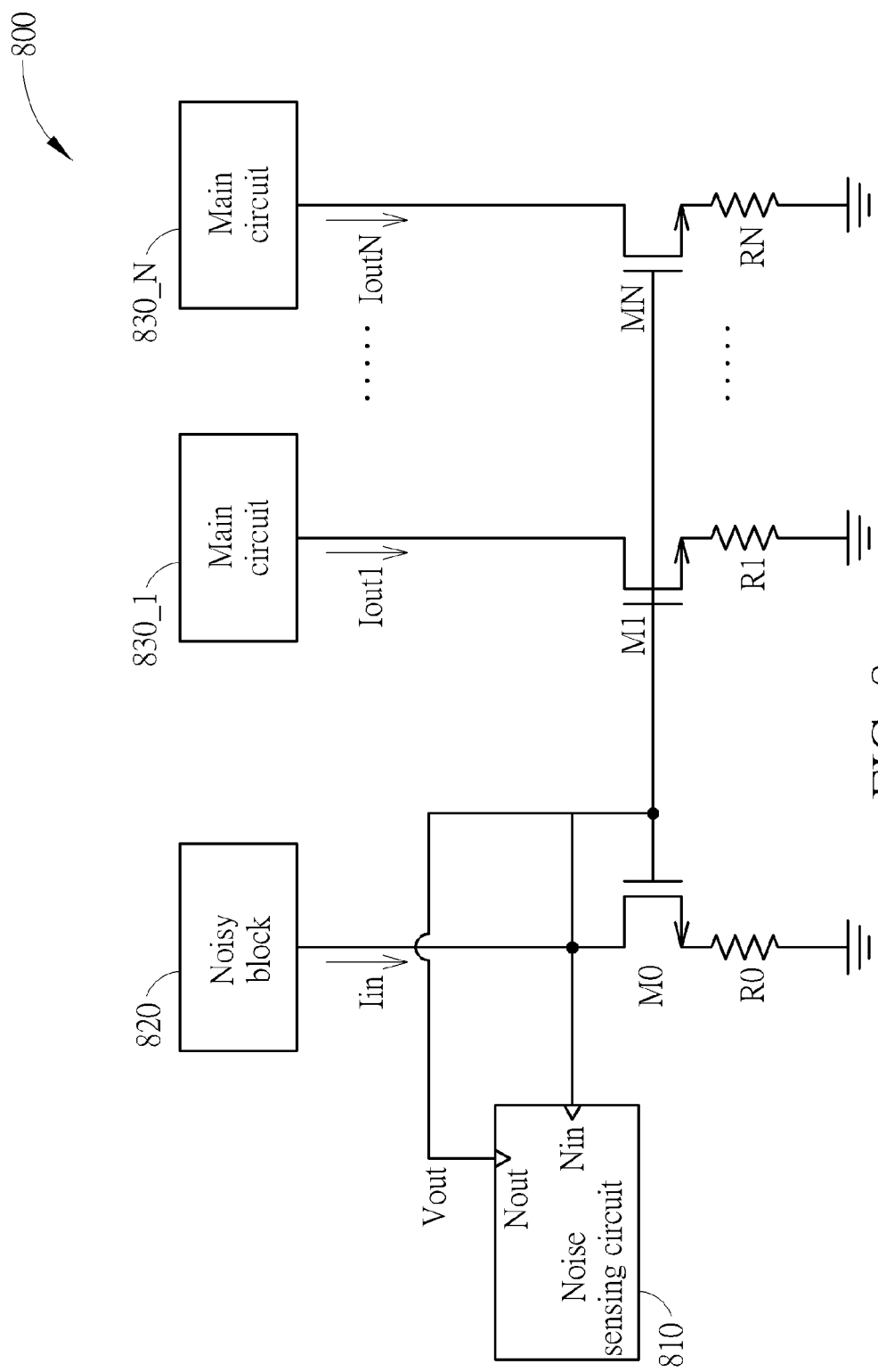
FIG. 8 is a diagram illustrating a circuit according to another embodiment of the present invention.

In the circuit 100 shown in FIG. 1, each of the transistors M0-MN are implemented by PMOS. However, the transistors M0-MN may be implemented by NMOSs to achieve the same results. FIG. 8 shows a diagram illustrating a circuit 800 according to another embodiment of the present invention. As shown in FIG. 8, the circuit 800 comprises a noise sensing circuit 810, a noisy block 820, a plurality of main circuits 830_1-830_N, a plurality of transistors (NMOS) M0-MN, and a plurality of resistors R0-RN. In this embodiment, the circuit 800 is used to cancel the noise contributed from the previous stages (e.g. the noisy block 820) and to provide noise-cancelled signals to the following stages (e.g. the main circuits 830_1-830_N).

The embodiment shown in FIG. 8 is similar to the embodiment shown in FIG. 1 but the implementations of the transistors M0-MN. That is the operations of the noise sensing circuit 810, the noisy block 820, and main circuits 830_1-830_N are substantially the same as the operations of the noise sensing circuit 110, the noisy block 120, and main circuits 130_1-130_N, respectively. Therefore, further descriptions about the circuit 800 are omitted here.

Figure 9:
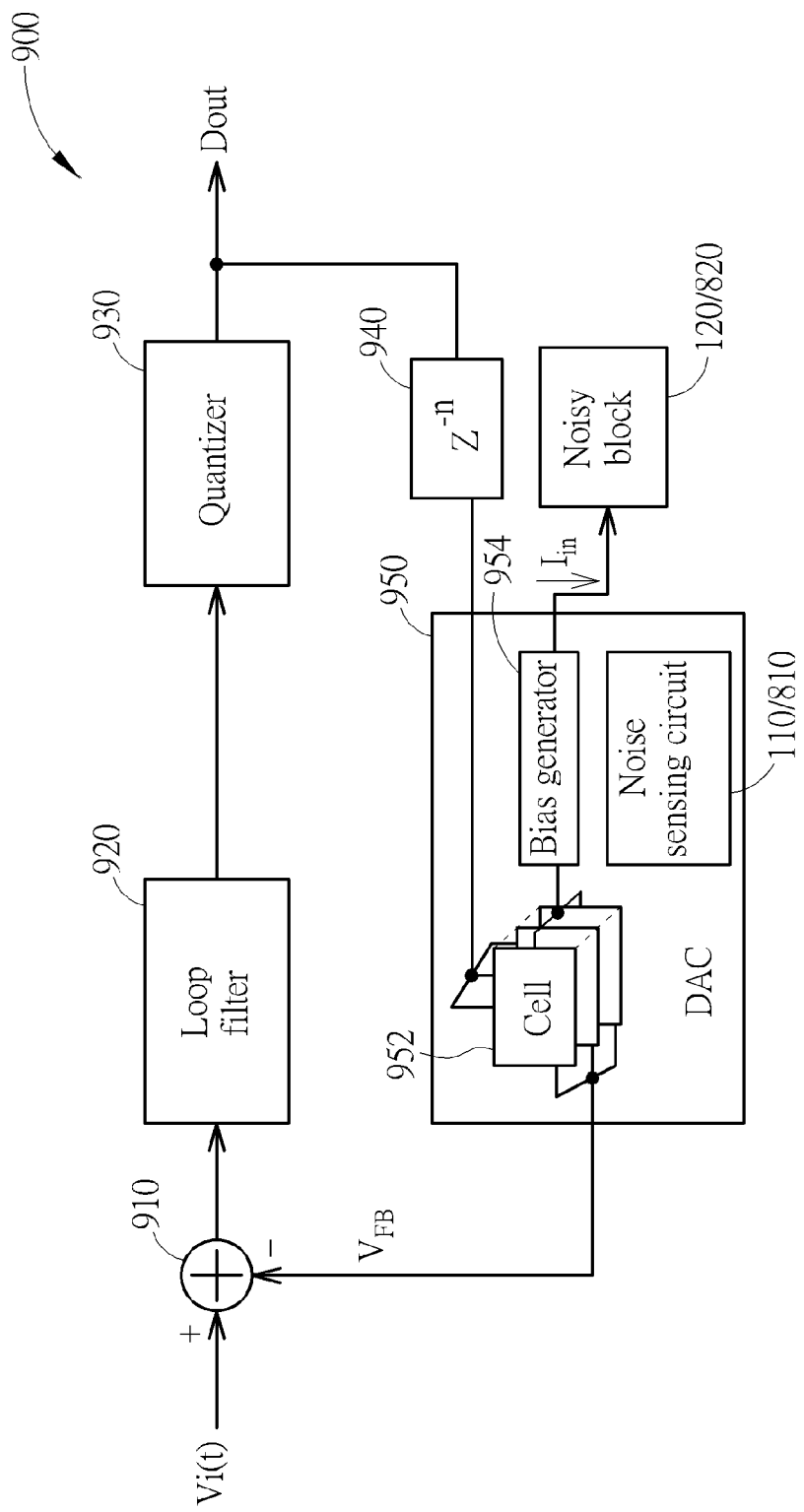
FIG. 9 is a diagram illustrating a continuous time delta-sigma modulator according to one embodiment of the present invention.

FIG. 9 is a diagram illustrating a continuous time delta-sigma modulator 900 according to one embodiment of the present invention. As shown in FIG. 9, the continuous time delta-sigma modulator 900 comprises a receiving circuit 910, a loop filter 920, a quantizer 930, a phase delay/adjusting circuit 940 and a DAC 950. The receiving circuit 910 receives an input signal Vi(t) and a feedback signal $V_{FB}$, and calculates a difference by subtracting the feedback signal $V_{FB}$ by the input signal Vi(t) to generate a summation signal. The loop filter 920 is arranged to filter the summation signal to generate a filtered summation signal. The quantizer 930 is arranged to generate a digital output Dout according to the filtered residual signal. Then, the digital output Dout is processed by the phase delay/adjusting circuit 940, and the DAC 950 performs a digital-to-analog converting operation upon the signals outputted from the phase delay/adjusting circuit 940 to generate the feedback signal $V_{FB}$ to the receiving circuit 910.

The DAC 950 comprises a plurality of cells 952, a bias generator 954 and a noise sensing circuit 110/810, where the bias generator 954 receives the input current Iin generated from the noisy block 120/820 to generate bias currents to the cells 952 respectively. In this embodiment, the bias generator 954 may corresponds to the transistors M0-MN shown in FIG. 1, and each of the cells 952 generates an analog output current or an analog output voltage according to the bias current provided by one of the transistors M1-MN and the digital data outputted by the phase delay/adjusting circuit 940, where a summation of the analog output currents or the analog output voltages of the cells 952 is represented by the feedback signal $V_{FB}$ shown in FIG. 9. In the embodiment shown in FIG. 9 because the DAC 950 comprises the noise sensing circuits 110/810 that are applied to the bias generator 954 within the DAC 950 to cancel the noise component of the input current Iin provided by the noisy block 120/820 the feedback signal $V_{FB}$ may be cleaner because the noise component contributed by the noisy block 120/820 is cancelled within the DAC 950, that is the DAC noise can be greatly improved.

Briefly summarized, in the noise reduction technique of the present invention, a noise reduction loop provided by the noise sensing circuit is applied to cancel the noise from a noisy block, to make the following stages able to receive noise-cancelled signals. In one embodiment, the noise reduction technique can be applied to a DAC of a delta-sigma modulator to reduce the DAC noise.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit, comprising:
    a transistor;
    a signal generating circuit, coupled to the transistor, for providing an input signal; and
    a noise sensing circuit, coupled to the transistor and the signal generating circuit, for receiving the input signal provided by the signal generating circuit to generate an output signal to the transistor;
    wherein a signal component of the output signal generated by the noise sensing circuit cancels out a signal component of the input signal provided by the signal generating circuit, and the output signal and the input signal have opposite polarities.

2. The circuit of claim 1, wherein each of the signal component of the output signal and the signal component of the input signal is a noise component.

3. The circuit of claim 1, wherein a gate electrode and a drain electrode of the transistor are coupled to each other, the drain electrode of the transistor is coupled to the signal generating circuit and an input terminal of the noise sensing circuit, and the gate electrode of the transistor is coupled to an output terminal of the noise sensing circuit.

4. The circuit of claim 1, wherein the noise sensing circuit comprises:
    an N-type transistor, wherein a gate electrode of the N-type transistor serves as an input terminal to receive the input signal from the signal generating circuit, and a drain electrode of the N-type transistor is coupled to an output terminal for generating the output signal; and
    a P-type transistor, wherein the gate electrode and the drain electrode of the P-type transistor are coupled to the drain electrode of the N-type transistor.

5. The circuit of claim 4, wherein the noise sensing circuit further comprises:
    a capacitor, coupled between the output terminal and the drain electrode of the N-type transistor.

6. The circuit of claim 1, wherein the noise sensing circuit comprises:
    a P-type transistor, wherein a gate electrode of the P-type transistor serves as an input terminal to receive the input signal from the signal generating circuit, and a drain electrode of the P-type transistor is coupled to an output terminal for generating the output signal; and
    an N-type transistor, wherein the gate electrode and the drain electrode of the N-type transistor are coupled to the drain electrode of the P-type transistor.

7. The circuit of claim 6, wherein the noise sensing circuit further comprises:
    a capacitor, coupled between the output terminal and the drain electrode of the P-type transistor.

8. The circuit of claim 1, wherein the noise sensing circuit comprises:
    an N-type transistor, wherein a gate electrode of the N-type transistor serves as an input terminal to receive the input signal from the signal generating circuit, and a drain electrode of the N-type transistor serves as an output terminal for generating the output signal;

a first resistor, coupled between a ground voltage and a source electrode of the N-type transistor; and a second resistor, coupled between a supply voltage and the drain electrode of the N-type transistor.

9. The circuit of claim 1, wherein the noise sensing circuit comprises:

a P-type transistor, wherein a gate electrode of the P-type transistor serves as an input terminal to receive the input signal from the signal generating circuit, and a drain electrode of the P-type transistor serves as an output terminal for generating the output signal;

a first resistor, coupled between a ground voltage and the drain electrode of the P-type transistor; and a second resistor, coupled between a supply voltage and a source electrode of the P-type transistor.

10. The circuit of claim 1, further comprising:

a current mirror, coupled to the transistor, for mirroring a current from the transistor to generate a mirrored current to a main circuit;

wherein there is no low-pass filter positioned between the current mirror and the transistor.

11. The circuit of claim 10, wherein the current mirror comprises another transistor whose gate electrode is connected to the gate electrode of the transistor, and the noise sensing circuit generates the output signal to the gate electrode of the transistor to cancel or reduce a noise level caused by the input signal provided by the signal generating circuit.

12. The circuit of claim 10, wherein the main circuit is a delta-sigma modulator.

13. The circuit of claim 12, wherein the mirrored current flows into an input terminal of the delta-sigma modulator.

14. The circuit of claim 1, wherein the signal generating circuit is a bandgap reference voltage generator or a reference current generator.

15. A delta-sigma modulator, comprising:

a receiving circuit, for receiving a feedback signal and an input signal to generate a summation signal;

a loop filter comprising a plurality of amplifying stages connected in series and arranged to receive the summation signal to generate a filtered summation signal;

a quantizer, coupled to the loop filter, for generating a digital output signal according to the filtered summation signal; and a digital to analog converter, coupled to the quantizer and the receiving circuit, for performing a digital to analog converting operation upon a signal derived from the digital output signal to generate the feedback signal to the receiving circuit; and wherein the digital to analog converter comprises a circuit, and the circuit comprises:

a transistor;

a noise sensing circuit, coupled to the transistor and a signal generating circuit, for receiving an input signal provided by the signal generating circuit to generate an output signal to the transistor, wherein a signal component of the output signal generated by the noise sensing circuit cancels out a signal component of the input signal provided by the signal generating circuit, and the output signal and the input signal have opposite polarities; and a current mirror, coupled to the transistor, for mirroring a current from the transistor to generate a mirrored current to the receiving circuit.

16. The delta-sigma modulator of claim 15, wherein each of the signal component of the output signal and the signal component of the input signal is a noise component.

17. The delta-sigma modulator of claim 15, wherein a gate electrode and a drain electrode of the transistor are coupled to each other, the drain electrode of the transistor is coupled to the signal generating circuit and an input terminal of the noise sensing circuit, and the gate electrode of the transistor is coupled to an output terminal of the noise sensing circuit.

18. The delta-sigma modulator of claim 15, wherein the current mirror comprises another transistor whose gate electrode is connected to the gate electrode of the transistor, and the noise sensing circuit generates the output signal to the gate electrode of the transistor to cancel or reduce a noise level caused by the input signal provided by the signal generating circuit.

19. The delta-sigma modulator of claim 15, wherein the signal generating circuit is a bandgap reference voltage generator or a reference current generator.

20. The delta-sigma modulator of claim 15, wherein the signal generating circuit is the reference current generator, and the reference current generator is arranged to provide a reference current to the digital to analog converter, and the input signal is generated according to the reference current.

* * * * *